(12) United States Patent
Perkiö et al.

(10) Patent No.: US 11,022,651 B2
(45) Date of Patent: Jun. 1, 2021

(54) ARRANGEMENT AND METHOD FOR A SAFE TURN OFF

(71) Applicant: Vacon Oy, Vaasa (FI)

(72) Inventors: Jani Perkiö, Tampere (FI); Antti Sorri, Orismala (FI); Pekka Hemminki, Laihia (FI)

(73) Assignee: Vacon OY, Vaasa (FI)

( * ) Notice: Subject to any disclaimer, the term of this patent is extended or adjusted under 35 U.S.C. 154(b) by 120 days.

(21) Appl. No.: 16/486,371

(22) PCT Filed: Mar. 2, 2017

(86) PCT No.: PCT/EP2017/054885
§ 371 (c)(1),
(2) Date: Aug. 15, 2019

(87) PCT Pub. No.: WO2018/157931
PCT Pub. Date: Sep. 7, 2018

(65) Prior Publication Data
US 2020/0003837 A1 Jan. 2, 2020

(51) Int. Cl.
*G01R 31/327* (2006.01)
*G01R 31/40* (2020.01)
*G05B 9/02* (2006.01)

(52) U.S. Cl.
CPC ......... *G01R 31/3277* (2013.01); *G01R 31/40* (2013.01); *G05B 9/02* (2013.01)

(58) Field of Classification Search
None
See application file for complete search history.

(56) References Cited

U.S. PATENT DOCUMENTS

2006/0214515 A1 9/2006 Pullmann et al.
2008/0310063 A1* 12/2008 Kawamura ........ G01R 19/0084
361/79

(Continued)

FOREIGN PATENT DOCUMENTS

EP 2782112 A1 9/2014

OTHER PUBLICATIONS

International Search Report for PCT Application No. PCT/EP2017/054885 dated Nov. 11, 2017.

*Primary Examiner* — Jas A Sanghera
(74) *Attorney, Agent, or Firm* — McCormick, Paulding & Huber PLLC

(57) ABSTRACT

A safety circuit coupled between a first direct current (DC) circuit and a second DC circuit, wherein the first DC circuit supplies power to the second DC circuit. The safety circuit comprises a first series connection between positive poles of the first and second DC circuits (the first series connection comprising a first diode, a second diode and a first controllable switch), a second series connection between negative poles of the first and second DC circuits (the second series connection comprising a third diode, a fourth diode and a second controllable switch), a first energy storage device (coupled between the positive pole of the second DC circuit and the first terminal of the second controllable switch), and a second energy storage device (coupled between the negative pole of the second DC circuit and the first terminal of the first controllable switch). The safety circuit further comprises a first feedback circuit for indicating an active state of the first controllable switch and a second feedback circuit for indicating an active state of the second controllable switch.

21 Claims, 3 Drawing Sheets

(56) References Cited

U.S. PATENT DOCUMENTS

2009/0251835 A1 10/2009 Meinherz
2014/0028453 A1 1/2014 Schwenkel et al.

* cited by examiner

ARRANGEMENT AND METHOD FOR A SAFE TURN OFF

CROSS-REFERENCE TO RELATED APPLICATIONS

This application is a National Stage application of International Patent Application No. PCT/EP2017/054885 filed on Mar. 2, 2017, which is hereby incorporated by reference in its entirety.

TECHNICAL FIELD

The present invention relates to functional safety in a power electronic device.

BACKGROUND

The objective of functional safety is freedom from unacceptable risk of physical injury or of damage to the health of people either directly or indirectly. The principles on how to carry out safety functions are covered by international standards, e.g. IEC61508 gives the requirements for electric systems.

An example of functional safety is the so-called safe turn-off (STO) function, which in connection to power electronic devices means that it must be possible to switch the output power off in a reliable way. The reliability requirement typically means that the design of the electric circuitry between the operator (i.e. a person who presses the on/off button) and the actuator (i.e. the power electronic component which connects the output power on/off) must be reliable and its functionality needs to be testable.

In modern power electronic devices, controllable power semiconductor switches, e.g. insulated gate bipolar transistors (IGBT), are normally used as power switches in main circuits. In a STO situation it should be ensured that all power switches stay in off-state. One safe way to ensure this is to switch off the auxiliary voltage, which supplies energy to the gate drivers for generating control pulses for the controllable power semiconductor switches. A problem when using this method is that the functional test of the safety function interrupts the operation of the device, which is not desirable in many processes operating continuously.

SUMMARY

The objective of the present invention is to provide a novel arrangement and a novel method for ensuring that the functionality of the output power turn off circuitry can be tested. According to the invention, the operating condition of critical safety related components in a DC auxiliary voltage delivery system can be tested regularly during the operation of a power electronic device, without interrupting its operation. The following is a brief summary in order to provide basic understanding of some aspects of various embodiments of the invention, a more detailed description of exemplifying embodiments are given later. The objective of the invention is achieved by what is stated in the independent claims, other preferred embodiments are disclosed in the dependent claims.

The basic characteristic feature of the safe turn-off arrangement according to the present invention is that a DC auxiliary voltage of a functional unit, which as unpowered ensures the safety of the output connection of a power electronic device, is supplied via a safety circuit comprising the following features:

Each pole of the DC auxiliary voltage can be disconnected separately,

When only one DC pole is disconnected, an energy storage device maintains the output voltage of the safety circuitry above a limit value for at least a predefined time period, When both DC poles are disconnected, the output voltage drops below a limit value without delay, and The safe turn-off circuit generates component-specific feedback signals indicating the operating states of those critical components which perform the DC pole disconnection.

In a safe turn-off arrangement, the comparison of operating instructions and corresponding feedback signals provide a reliable indication of the functionality of the safety-critical DC circuit disconnecting components, which is a condition to meet the requirements of safety standards, e.g. IEC61508. The comparison can be performed in any control block supervising the functional safety of a power electronics device, e.g. in a control unit of a frequency converter.

The component used to disconnect a DC auxiliary voltage pole may be e.g. a MOSFET transistor, a bipolar transistor, a mechanical switch etc. The feedback signal for monitoring the functionality of the disconnecting component may be formed e.g. by using an optocoupler.

In a method according to the present invention, the functionality of the safety circuitry can be tested regularly by short disconnecting periods of one DC auxiliary voltage pole at a time. The testing time period can be selected to be sufficiently short that during the test pulse the output voltage of the safety circuitry stays above a minimum operation level of the load circuit.

In a safe turn off situation both poles of the DC auxiliary voltage are disconnected simultaneously.

The arrangement and method according to the present invention makes it possible to test the functionality of a safe turn off circuit during the operation of the power electronics device without interrupting the normal operation of the power electronics device. In a safe turn off situation, the circuit disconnects the auxiliary voltage, thereby ensuring that energizing the output terminals of the power electronic device is prevented quickly.

BRIEF DESCRIPTION OF DRAWINGS

Below the invention is explained more detailed by using examples with references to the enclosed figures, wherein.

DETAILED DESCRIPTION

Figure 1:
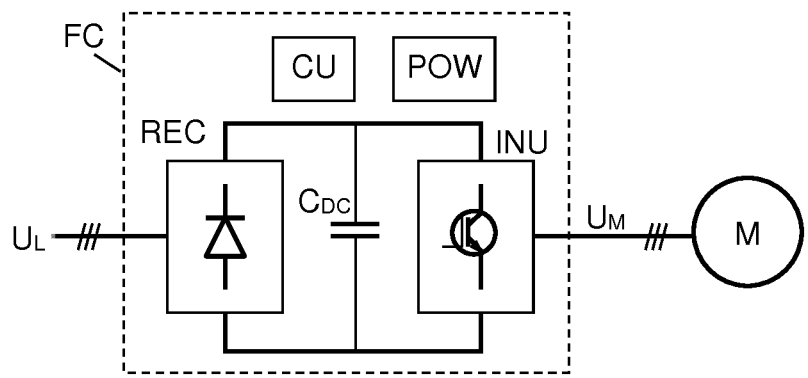
FIG. 1 presents a main circuit of a frequency converter drive.

FIG. 1 presents a simplified main circuit diagram of a variable speed motor drive as an example of a power electronic device wherein a functional safety circuitry according to the present invention is applicable. In the figure, a frequency converter FC is used to control the shaft rotating speed of an AC motor M. The frequency converter FC in this example comprises a rectifier REC, rectifying the three-phase supply voltage $U_L$ into a constant DC-link voltage filtered by a capacitor $C_{DC}$, and a three-phase inverter unit INU, creating a three-phase adjustable output voltage $U_M$ for supplying the motor M. INU consists of controllable power semiconductor switches, normally IGBTs (not presented), and free-wheeling diodes (not presented). The frequency converter FC comprises also a control unit CU and an auxiliary voltage power supply POW, which converts an input voltage from the DC-link into several lower level output DC-voltages for e.g. the control unit CU and the gate driver unit of INU (not presented).

In a STO situation the rotation of a motor shaft, induced by the output voltage of the frequency converter, should be prevented. This target can be met by ensuring that all controllable power semiconductor switches of INU stay in an off-state.

Figure 2:
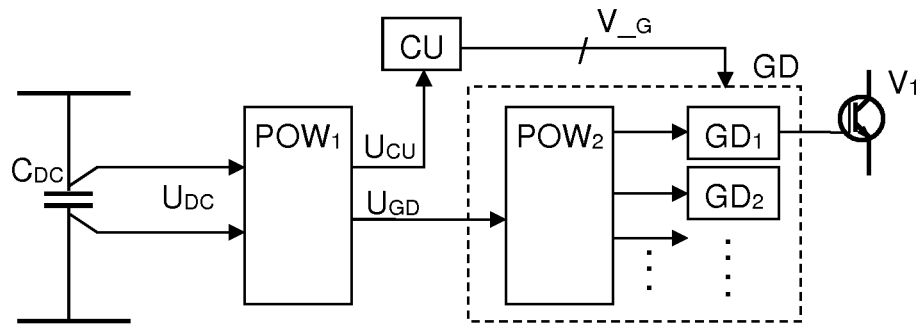
FIG. 2 presents an auxiliary voltage arrangement.

FIG. 2 presents a simplified example of a control and auxiliary voltage supply system in a frequency converter. The first auxiliary power supply $POW_1$ converts the DC-link voltage $U_{DC}$ into a first lower voltage $U_{CU}$ for the control unit CU and into a second lower voltage $U_{GD}$ for the gate driver unit GD. Inside the gate driver unit GD a second auxiliary voltage power supply $POW_2$ converts the $U_{GD}$ voltage into isolated auxiliary voltages for each gate driver $GD_1$, $GD_2$, ... which form the control signals of the inverter controllable power semiconductor switches (only $V_1$ presented) according to the control signals $V_{-G}$ received from the control unit CU.

Figure 3:
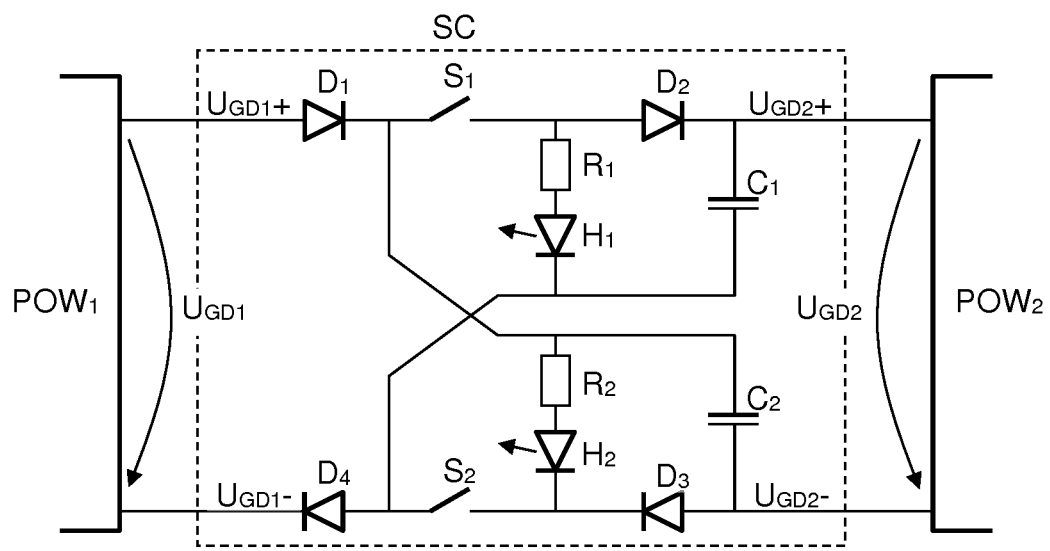
FIG. 3 presents a safety circuit.

FIG. 3 presents an example of a safety circuit SC according to the present invention. The circuit SC is located between a first auxiliary voltage power supply $POW_1$, having an output DC voltage $U_{GD1}$ with a positive pole $U_{GD1}+$ and a negative pole $U_{GD1}-$, and a second auxiliary power supply $POW_2$, having input DC voltage $U_{GD2}$ with a positive pole $U_{GD2}+$ and a negative pole $U_{GD2}-$. The safety circuit comprises the following:

A series connection of a first diode $D_1$, a first switch $S_1$ and a second diode $D_2$ between $U_{GD1}+$ and $U_{GD2}+$ such that the forward direction of both diodes are connected towards $U_{GD2}+$, A series connection of a third diode $D_3$, a second switch $S_2$ and a fourth diode $D_4$ between $U_{GD1}-$ and $U_{GD2}-$ such that the forward direction of both diodes are connected towards $U_{GD1}-$, A first energy storage device, advantageously a capacitor $C_1$, connected between $U_{GD2}+$ and the anode terminal of $D_4$, A second energy storage device, advantageously a capacitor $C_2$, connected between the cathode terminal of $D_1$ and $U_{GD2}-$, A first feedback circuit comprising a series connection of a resistor $R_1$ and a light emitting photodiode of an optocoupler $H_1$, connected between the anode terminals of $D_2$ and $D_4$ such that the forward direction of the optocoupler light emitting diode is connected towards $S_2$, and A second feedback circuit comprising a series connection of a resistor $R_2$ and a light emitting photodiode of an optocoupler $H_2$, connected between the cathode terminals of $D_1$ and $D_3$ such that the forward direction of the optocoupler light emitting diode is connected towards $S_2$.

Figure 4:
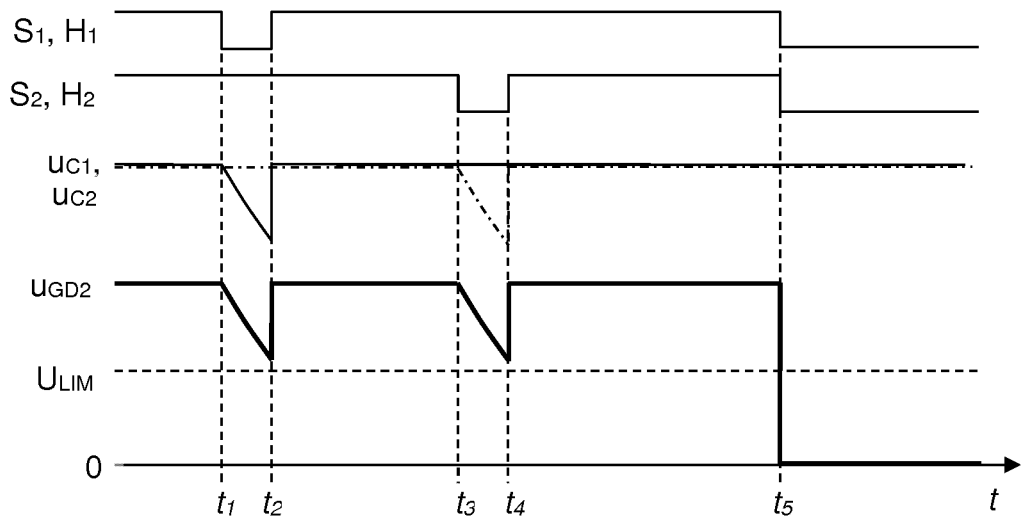
FIG. 4 illustrates operation of the safety circuit.

FIG. 4 illustrates operation of the safety circuit presented in FIG. 3. The purpose of the curves is just to illustrate operating principles, they are not drawn to scale relative to each other. Signals S and H indicate the operation of switches $S_1$, $S_2$ and operating states of the feedback signals $H_1$, $H_2$, such that a high state means a close-state of a switch and an active state of the feedback signal.

In normal operating situation, before time instant $t_1$, both switches S1, S2 are in close-state which means that $U_{GD1+}$ is connected to $U_{GD2+}$ via diodes $D_1$, $D_2$, and $U_{GD1-}$ is connected to $U_{GD2-}$ via diodes $D_3$, $D_4$. Thus the input voltage $U_{GD2}$ of $POW_2$ is close to the output voltage $U_{GD1}$ of $POW_1$. Further, with both switches S1, S2 in the close-state, current flows through both the optocouplers $H_1$, $H_2$, thereby indicating the normal functionality of the safety circuit SC.

At time instant $t_1$ the switch $S_1$ turns to open-state. Since current cannot flow to the optocoupler H1 from either the first auxiliary power supply POW1 (due to the open switch S1) or the second auxiliary power supply POW2 (due to the blocking diode D2), the feedback signal of $H_1$, indicating the operating state of $S_1$, turns into a non-active state. In $S_1$ open state, $U_{GD1+}$ is not any more connected to $U_{GD2+}$, but due to the energy charged in $C_1$ before $t_1$ its voltage $u_{C1}$ and also the voltage $U_{GD2}$ decreases at a limited rate. $S_1$ is turned back to close-state at time instant $t_2$ before $U_{GD2}$ has reached the minimum operating voltage limit $U_{LIM}$ of $POW_2$. Thus $POW_2$ can continue its normal operation also during time period $t_1$-$t_2$, and at the same time the feedback signal $H_1$ indicates that the switch $S_1$ is operative.

A similar operating condition test described above with respect to $S_1$ is made for $S_2$ during the time period $t_3$-$t_4$. Similar to $C_1$ above, during the test the energy of capacitor $C_2$ prevents the voltage $U_{GD2}$ from falling below the limit $U_{LIM}$. As shown in FIG. 4, at time instant $t_3$ the switch $S_2$ turns to open-state. Since current cannot flow from the optocoupler H2 to either the first auxiliary power supply POW1 (due to the open switch S2) or the second auxiliary power supply POW2 (due to the blocking diode D3), the feedback signal of $H_2$, indicating the operating state of $S_2$, turns into a non-active state. In $S_2$ open state $U_{GD1+}$ is not any more connected to $U_{GD2+}$, but due to the energy charged in $C_2$ before $t_3$, its voltage $u_{C2}$ and also the voltage $U_{GD2}$ decreases at a limited rate. $S_2$ is turned back to close-state at time instant $t_4$ before $u_{GD2}$ has reached the minimum operating voltage limit $U_{LIM}$ of $POW_2$. Thus $POW_2$ can continue its normal operation also during time period $t_3$-$t_4$, and at the same time the feedback signal $H_2$ indicates that the switch $S_1$ is operative.

At time instant $t_5$ both switches $S_1$, $S_2$ are turned to open-state, as a consequence of a STO command. Now the open switches prevent direct connections between $U_{GD1}$ and $U_{GD2}$ via diodes $D_1$-$D_4$, and the open switches prevent also the full charged capacitors $C_1$, $C_2$ to supply energy to $POW_2$. Thus the voltage $u_{GD2}$ falls immediately to 0, which means that if $POW_2$ is not any more capable to supply auxiliary voltages for the gate drivers in an arrangement like presented in FIG. 2. Missing auxiliary voltage prevents the gate drivers to generate turn-on pulses for the main circuit controllable power semiconductor switches, which is the target in a safe turn-off situation. Noteworthy is also that in case of a switch component failure, i.e. $S_1$ or $S_2$ stuck in close-state, the condition of a safe turn-off will be met, but with a delay due to the stored energy of $C_1$ or $C_2$.

Figure 5:
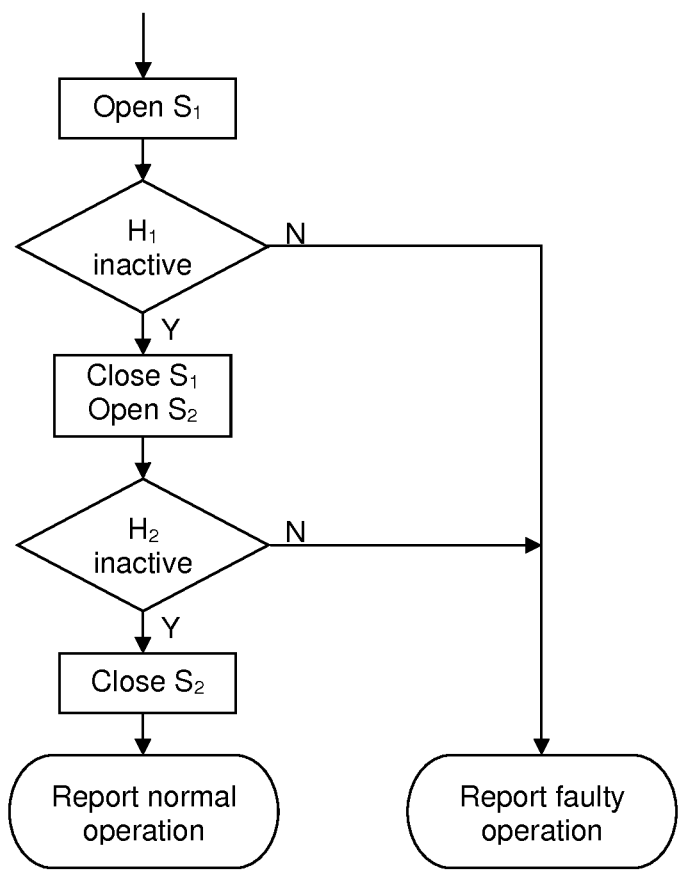
FIG. 5 presents a flow chart showing an exemplary testing algorithm for the safety circuit.

FIG. 5 is a flow chart showing an exemplary testing algorithm for the safety circuit. The flow chart starts in a normal operation mode of the safety circuit (in which the switches $S_1$, $S_2$ are closed and the optocouplers $H_1$, $H_2$ are in an active state. Next, the first switch $S_1$ is opened and it is determined whether the optocoupler $H_1$ changes to an inactive state. If so, the algorithm proceeds to the next step, otherwise the algorithm terminates with a fault being reported. At the next step, the first switch $S_1$ is closed and the second switch $S_2$ is opened and it is determined whether the optocoupler $H_2$ changes state. If so, the algorithm terminates with an indicates that the circuit is working normally; if not, the algorithm terminates with a fault being reported.

Figure 6:
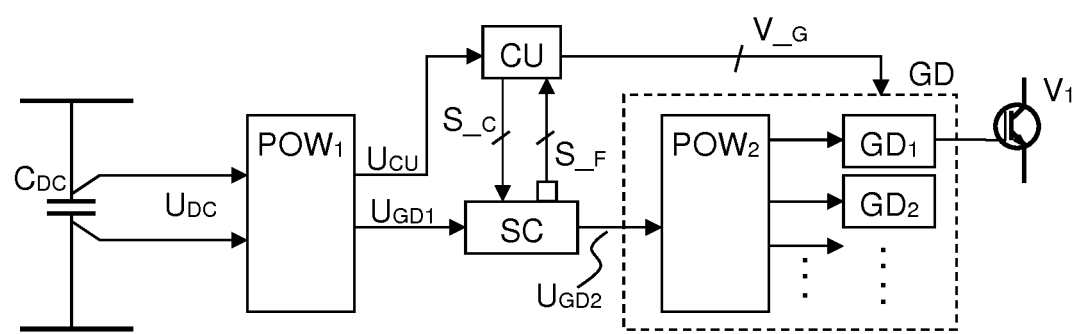
FIG. 6 presents an auxiliary voltage arrangement including a safety circuit.

FIG. 6 presents an otherwise similar simplified example of a control and auxiliary voltage supply system in a frequency converter as presented in FIG. 2, but with an added safety circuit SC. In this example the first auxiliary voltage $U_{GD1}$ is wired via a safety circuit SC, corresponding to the circuit of FIG. 3, in order to form the final auxiliary voltage $U_{GD2}$ for the gate driver unit GD. The control unit CU forms the control signals $S_{\_C}$ for the switches ($S_1$, $S_2$ in FIG. 3), receives the feedback signals $S_{\_F}$, indicating the operating states of the switches, and performs the logical operations needed to meet the functional safety requirements. The feedback signals $S_{\_F}$ may include the output of optocoupler phototransistors.

The phototransistor parts of the above-mentioned optocouplers $H_1$ and $H_2$ are shown only in highly schematic form in FIG. 6. Advantageously the phototransistors are connected to a safety logic (which may form part of the control unit CU and may be separate to the control unit CU) belonging to a safety arrangement according to the present invention, in which arrangement the functionality of the safety-critical components are monitored continuously by comparing the operating instructions of switches $S_1$, $S_2$, and corresponding feedback signals from optocouplers $H_1$, $H_2$. Note that above an optocoupler is used just as an example of an advantageous component, also other commercial signal transmitting devices with isolation between the sender (corresponding a photodiode above) and the receiver (corresponding a phototransistor above) exist.

The specific examples provided in the description above are not exhaustive unless otherwise explicitly stated, nor should they be construed as limiting the scope and/or the applicability of the accompanied claims. The features recited in the accompanied dependent claims are mutually freely combinable unless otherwise explicitly stated. The verbs "to comprise" and "to include" are used in this document as open limitations that neither exclude nor require the existence of also un-recited features. Furthermore, it is to be understood that the use of "a" or "an", i.e. a singular form, throughout this document does not exclude a plurality.

What is claimed is:

1. A safety circuit coupled between a first direct current (DC) circuit and a second DC circuit, wherein the first DC circuit supplies power to the second DC circuit, the safety circuit comprising:
   a first series connection between positive poles of the first and second DC circuits, the first series connection comprising a first diode with an anode coupled to the first DC circuit and a cathode coupled to a first terminal of a first controllable switch, and a second diode with an anode coupled to a second terminal of the first controllable switch and a cathode coupled to the second DC circuit,
   a second series connection between negative poles of the first and second DC circuits, the second series connection comprising a third diode with an anode coupled to the second DC circuit and a cathode coupled to a second terminal of a second controllable switch, and a fourth diode with an anode coupled to a first terminal of the second controllable switch and a cathode coupled to the first DC circuit,
   a first energy storage device, coupled between the positive pole of the second DC circuit and the first terminal of the second controllable switch,
   a second energy storage device, coupled between the negative pole of the second DC circuit and the first terminal of the first controllable switch,
   a first feedback circuit providing a first feedback signal for indicating an active state of the first controllable switch, and
   a second feedback circuit providing a second feedback signal for indicating an active state of the second controllable switch.

2. The safety circuit as claimed in claim 1, wherein the first energy storage device is dimensioned to maintain the voltage level of the second DC circuit above a predefined safety limit during opening of the first switch for a predefined test pulse period.

3. The safety circuit as claimed in claim 1, wherein the second energy storage device is dimensioned to maintain the voltage level of the second DC circuit above a predefined safety limit during opening of the second controllable switch for a predefined test pulse period.

4. The safety circuit according to claim 1, wherein said first and second energy storage devices are capacitors.

5. The safety circuit according to claim 1, wherein:
   the first feedback circuit is connected between the second terminal of the first switch and the first terminal of the second switch, and
   the second feedback circuit is connected between the first terminal of the first switch and the second terminal of the second switch.

6. The safety circuit according to claim 5, wherein:
   the first feedback circuit comprises a series connection of a first resistor and a sender of a first signal transmitter, and
   the second feedback circuit comprises a series connection of a second resistor and a sender of a second signal transmitter.

7. The safety circuit according to claim 6, wherein first and second optocouplers are used as the first and second signal transmitters respectively, wherein each optocoupler includes a photodiode working as a sender and is coupled such that the forward direction of the photodiode is towards the second switch.

8. A safe turn off arrangement, comprising a safety circuit according to claim 1, and a control device supervising the functional safety of a power electronics device, wherein the control device is arranged to control the operation of the controllable switches in the safety circuit, to receive the feedback signals from the safety circuit, to compare control signals of the controllable switches and the feedback signals and to use the comparison results as indicators of the functionality of safety-critical components.

9. A power electronics device comprising a safety circuit according to claim 1, wherein the second DC circuit supplies power to gate driver units, which gate driver units control the operation of controllable power electronic switches used to form an output voltage of the power electronics device.

10. A method of operating a safety circuit as claimed claim 1, the method comprising:
    operating in a normal mode in which both the first and second controllable switches are closed,
    opening one of the first and second controllable switches and, if the corresponding feedback signal remains in an active state, determining that the safety circuit is faulty.

11. The method as claimed in claim 10, further comprising:
    opening the other of the first and second controllable switches and, if the corresponding feedback signal remains in an active state, determining that the safety circuit is faulty.

12. The method as claimed in claim 10, wherein the relevant controllable switch is opened for a predefined period during which the voltage of the second DC circuit does not fall below a predefined minimum operation level.

13. The method as claimed in claim 10, further comprising opening both the first and second controllable switches in a safe turn off mode.

14. The safety circuit as claimed in claim 2, wherein the second energy storage device is dimensioned to maintain the voltage level of the second DC circuit above a predefined safety limit during opening of the second controllable switch for a predefined test pulse period.

15. The safety circuit according to claim 2, wherein said first and second energy storage devices are capacitors.

16. The safety circuit according to claim 3, wherein said first and second energy storage devices are capacitors.

17. The safety circuit according to claim 2, wherein:
the first feedback circuit is connected between the second terminal of the first switch and the first terminal of the second switch, and
the second feedback circuit is connected between the first terminal of the first switch and the second terminal of the second switch.

18. The safety circuit according to claim 3, wherein:
the first feedback circuit is connected between the second terminal of the first switch and the first terminal of the second switch, and
the second feedback circuit is connected between the first terminal of the first switch and the second terminal of the second switch.

19. The safety circuit according to claim 4, wherein:
the first feedback circuit is connected between the second terminal of the first switch and the first terminal of the second switch, and
the second feedback circuit is connected between the first terminal of the first switch and the second terminal of the second switch.

20. The safe turn off arrangement, comprising a safety circuit according to claim 2, and a control device supervising the functional safety of a power electronics device, wherein the control device is arranged to control the operation of the controllable switches in the safety circuit, to receive the feedback signals from the safety circuit, to compare control signals of the controllable switches and the feedback signals and to use the comparison results as indicators of the functionality of safety-critical components.

21. The power electronics device of claim 9, wherein the power electronics device is a frequency converter.

\* \* \* \* \*